(12) United States Patent
Wang et al.

(10) Patent No.: US 9,086,452 B2
(45) Date of Patent: Jul. 21, 2015

(54) THREE-DIMENSIONAL INTEGRATED CIRCUIT AND METHOD FOR WIRELESS INFORMATION ACCESS THEREOF

(75) Inventors: Mill-Jer Wang, Hsinchu (TW); Chewn-Pu Jou, Hsinchu (TW); Ching-Nen Peng, Hsinchu (TW); Huan-Neng Chen, Hsinchu (TW); Hung-Chih Lin, Hsinchu (TW); Kuang Kai Yen, Hsinchu (TW); Hao Chen, Hsinchu (TW); Feng Wei Kuo, Hsinchu (TW); Ming-Chieh Liu, Hsinchu (TW); Tsung-Hsiung Li, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 336 days.

(21) Appl. No.: 13/572,533

(22) Filed: Aug. 10, 2012

(65) Prior Publication Data

US 2014/0043148 A1    Feb. 13, 2014

(51) Int. Cl.
*G01R 31/28*    (2006.01)
*H01L 23/02*    (2006.01)
*G06F 17/50*    (2006.01)
*H01L 23/00*    (2006.01)
*H01L 25/065*    (2006.01)
*G01R 31/302*    (2006.01)

(52) U.S. Cl.
CPC ........ *G01R 31/2889* (2013.01); *G06F 17/5068* (2013.01); *G01R 31/3025* (2013.01); *H01L 24/16* (2013.01); *H01L 25/0657* (2013.01); *H01L 2224/16145* (2013.01); *H01L 2224/16225* (2013.01); *H01L 2225/06513* (2013.01); *H01L 2225/06517* (2013.01); *H01L 2225/06565* (2013.01); *H01L 2225/06596* (2013.01); *H01L 2924/15192* (2013.01); *H01L 2924/15311* (2013.01)

(58) Field of Classification Search
CPC ................. H01L 25/0657; H01L 2224/48145; H01L 2224/16145; H01L 2225/06513; H01L 2225/06565; G06F 17/5068; G06F 17/505; G06F 17/5054; G06F 31/3025
USPC .......... 714/734, 733, 736, 724; 257/686, 685, 257/777, 723; 365/201
See application file for complete search history.

(56) References Cited

U.S. PATENT DOCUMENTS

| | | | | |
|---|---|---|---|---|
| 8,596,544 B2* | 12/2013 | Kang | ............................. | 235/492 |
| 8,698,300 B2* | 4/2014 | Ko | ................. | 257/686 |
| 8,744,349 B2* | 6/2014 | Kuroda | ........................ | 455/41.1 |
| 2008/0142942 A1* | 6/2008 | Du et al. | ........................ | 257/686 |

FOREIGN PATENT DOCUMENTS

JP    2005-30877    2/2005

OTHER PUBLICATIONS

Office Action dated Jun. 17, 2014 from corresponding No. TW 101138983.

* cited by examiner

*Primary Examiner* — Christine Tu
(74) *Attorney, Agent, or Firm* — Lowe Hauptman & Ham, LLP

(57) ABSTRACT

A three-dimensional integrated circuit (3DIC) and wireless information access methods thereof are provided. The proposed 3DIC includes a semiconductor structure, and a wireless power device (WPD) formed on the semiconductor structure for wirelessly receiving a power for operating a function selected from a group consisting of probing the semiconductor structure, testing the semiconductor structure and accessing a first information from the semiconductor structure.

20 Claims, 8 Drawing Sheets

THREE-DIMENSIONAL INTEGRATED CIRCUIT AND METHOD FOR WIRELESS INFORMATION ACCESS THEREOF

FIELD

The present disclosure relates to a three-dimensional integrated circuit (3DIC) and a method for an information access of the 3DIC.

BACKGROUND

To access an information stored in a chip, conventionally, it requires extra power supplied and a sophisticated installation on tester, for example a probing card (or any other equipment), which causes inconvenient. In addition, a manual touch or a machine contact would induce electrostatic discharge (ESD) damage for the chip.

Tracking information through controlled collapse chip connection (C4)/through substrate via (TSV) increases area penalty (extra layout of power/ground/signals on C4/TSV), and once one of the connections is failed, the information is unreadable.

3DIC comprises a plurality of stacked chips provided from different companies or processes, and needs complete information recorded and being freely written/read, and the complete information comprises: company information, wafer tracking information (e.g. fabrication, process, part name and die-location), chip specification (test condition/setup and/or test results/parameters) and testing execution. Thus, there is a need to solve the above-mentioned problems.

SUMMARY

In accordance with one aspect of the present disclosure, a method for wireless information access in a three-dimensional integrated circuit (3DIC) includes steps of providing plural stacked chips including a wireless device, an information and a transmitting/receiving circuit; and accessing wirelessly the information via the wireless device and the transmitting/receiving circuit during a packaging process for the plural stacked chips.

In accordance with another aspect of the present disclosure, a testing method comprises steps of: providing a semiconductor structure having a wireless chip; wirelessly receiving a power by the wireless chip; and using the power to test the semiconductor structure.

In accordance with one more aspect of the present disclosure, a 3DIC comprises a semiconductor structure, and a wireless power device (WPD) formed on the semiconductor structure for wirelessly receiving a power for operating a function selected from a group consisting of probing the semiconductor structure, testing the semiconductor structure and accessing a first information from the semiconductor structure.

The present disclosure may best be understood through the following descriptions with reference to the accompanying drawings, in which:

DETAILED DESCRIPTION

Figure 1:
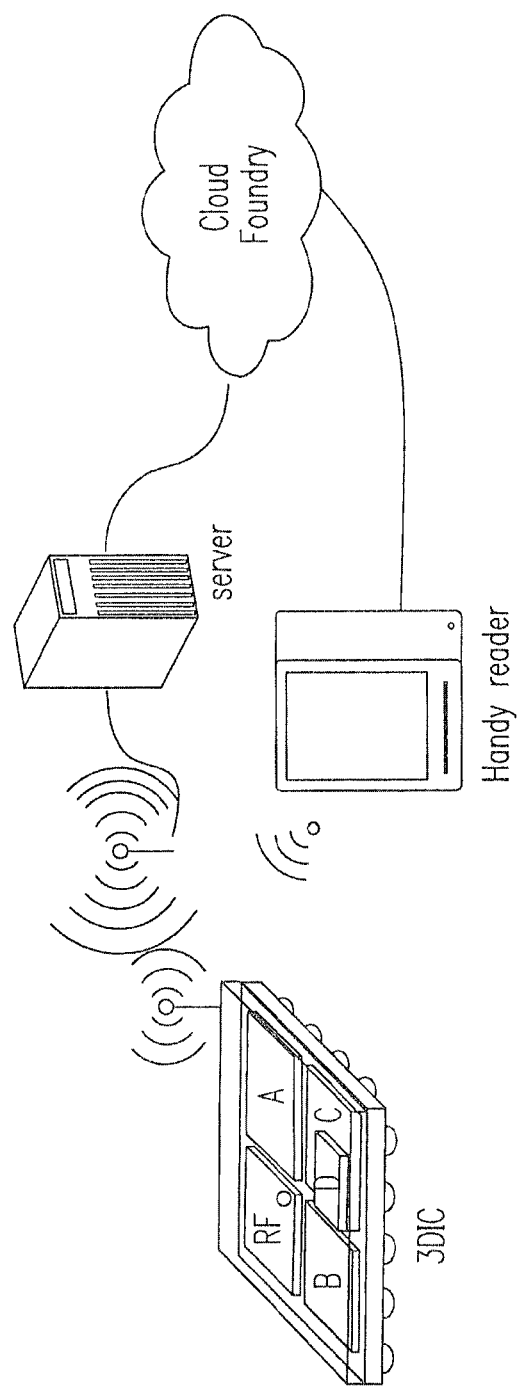
FIG. 1 is a schematic diagram of a 3DIC stacking, a server, a cloud foundry and a handy reader according to the first embodiment of the present disclosure.

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

The present disclosure provides a 3DIC stacking, having a wireless power device (WPD) for wirelessly receiving a power for operating a function selected from a group consisting of probing the semiconductor structure, testing the semiconductor structure and accessing an information from the semiconductor structure, and a method thereof to avoid the ESD damage and the area penalty.

The present disclosure relates to a wireless tracking implement on a 3DIC stacking, and provides a chip information anywhere without any equipment installation. FIG. 1 is a schematic diagram of a 3DIC stacking, a server, a cloud foundry and a handy reader according to the first embodiment of the present disclosure. The configuration of FIG. 1 is set up for wirelessly accessing the information contained in a 3DIC stacking. The 3DIC stacking and the server are wirelessly connected, there are two antennas shown in FIG. 1 too, where one antenna is for the 3DIC stacking and the other is for the server, and the 3DIC stacking and the handy reader are also wirelessly connected. However, the server and the cloud foundry are connected by a connection line, and so are the cloud foundry and the handy reader. The 3DIC stacking includes the chips (A, B, C and D) to be wirelessly accessed, which contains required information such as chip manufacturer's information, wafer tracking information, chip spec. and test execution information, and a radio frequency circuit (RF) for transmitting/receiving a radio frequency signal to/from the antenna of the 3DIC stacking. The Handy reader is an electronic book, being a tool for a user to read/write an information from/to the 3DIC stacking. The Cloud Foundry is an open platform as a service (also known as an open source cloud computing platform as a service (PaaS) software developed by VMware released under the terms of the Apache License 2.0.). The server is a physical computer (a computer hardware system) dedicated to running one or more client-server services (as a host), to serve the needs of users of the other computers (clients) on the network. The server could be an Automatic or Automated Test Equipment (ATE), or the like. Each the antenna is an electrical device which converts electric currents into radio waves, and vice versa. Each the antenna is usually used with a radio transmitter or radio receiver. In transmission, a radio transmitter applies an oscillating radio frequency electric current to the antenna's terminals, and the antenna radiates the energy from the current as electromagnetic waves (radio waves). In reception, an antenna intercepts some of the power of an electromagnetic wave in order to produce a tiny voltage at its terminals, that is applied to a receiver to be amplified. Each the antenna can be used for both transmitting and receiving. There are two connection lines, relatively between the Handy reader and the Cloud Foundry, and between the Cloud Foundry and the server, such that the required information related to the 3DIC stacking is quickly provided to (the user of) the Handy reader via the Cloud Foundry and the server in some embodiments. In some other embodiments, the user of the Handy reader sends out an instruction regarding the access of the information contained in the 3DIC stacking (e.g. reading an information) from the Handy reader via the antenna of the 3DIC stacking to the 3DIC stacking, and the 3DIC stacking reacts to provide a reply through the antenna of the 3DIC stacking, the antenna connected to the server, the server, the Cloud Foundry to the Handy reader such that the information contained in the 3DIC stacking is provided to (the user of) the Handy Reader. In some other embodiments, the user of the Handy reader sends out instructions regarding the access of the information contained in the 3DIC stacking (e.g. writing an information) from the Handy reader to the antenna of the 3DIC stacking and to the Cloud Foundry such that the information to be written could be sent to the 3DIC stacking through the Cloud foundry, the server, the antenna connected to the server, and the antenna of the 3DIC stacking. In some other embodiments, the user of the Handy reader sends out instructions regarding the access of the information contained in the 3DIC stacking (e.g. writing/reading an information) from the Handy reader to the antenna of the 3DIC stacking and receives the response of the 3DIC stacking from the antenna of the 3DIC stacking directly too.

Figure 2:
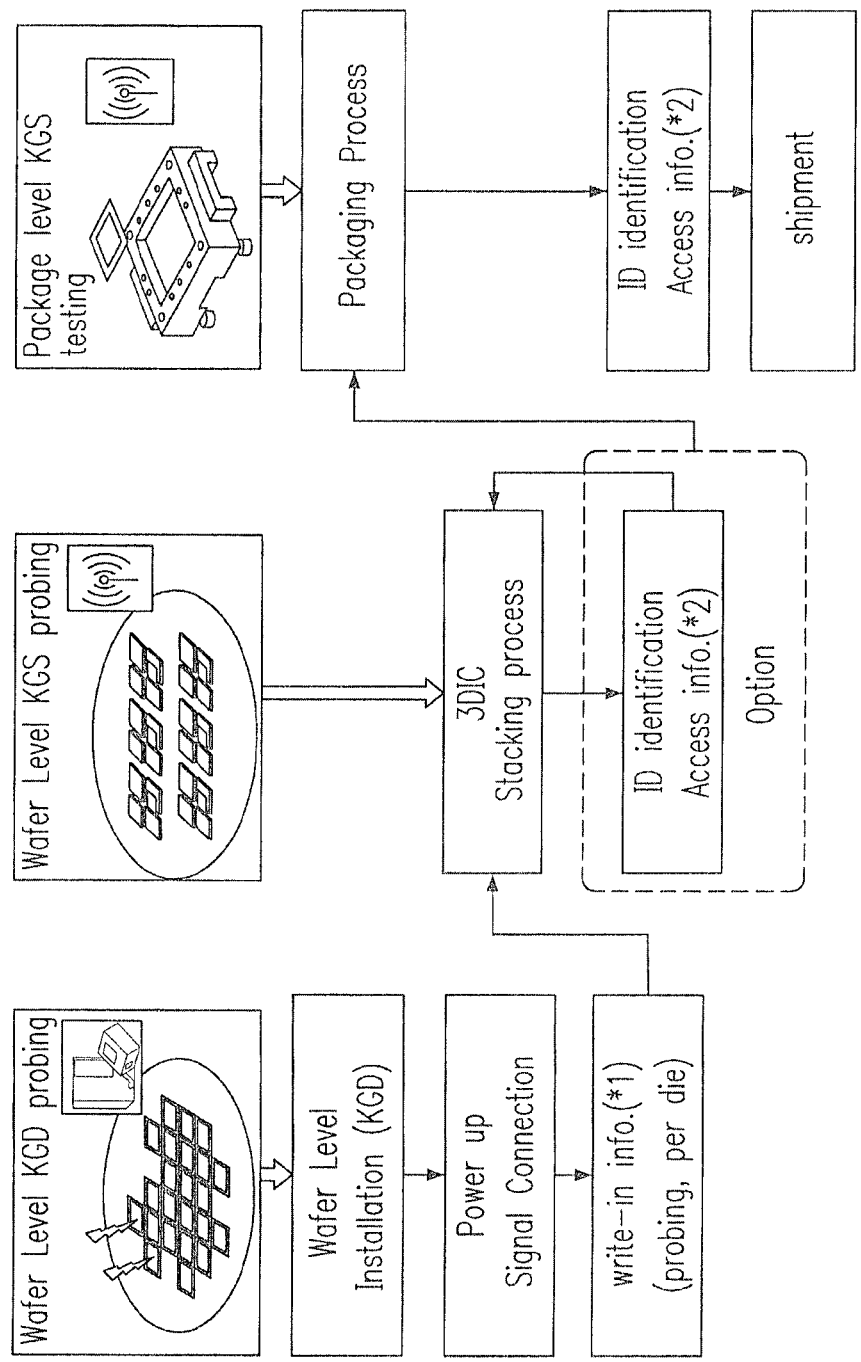
FIG. 2 is a flow chart of a method for a wireless information access of a 3DIC stacking according to the second embodiment of the present disclosure.

FIG. 2 is a flow chart of a method for a wireless information access of a 3DIC stacking according to the second embodiment of the present disclosure. In the KGD (known good die) probing stage of the wafer level, a conventional installation including a tester as aforementioned is involved. But in accordance with the present disclosure, in the KGS (known good stacking) probing stage of the wafer level, and in the KGS testing stage of the package level, no tester is required, and the information is accessed wirelessly through a configuration as shown in FIG. 1. Since the information is accessed wirelessly in the KGS probing stage of the wafer level and in the KGS testing stage of the package level, and the wafer level installation for KGS as well as a power up signal connection required in both of the conventional KGS probing stage of the wafer level and the conventional KGS testing stage of the package level could be omitted. In the KGD probing stage of the wafer level, it performs a wafer level installation for KGD and a power up signal connection, and provides a write-in information (*1) for probing per die. Since a conventional tester is used in the KGD probing stage of the wafer level, the power needs to be provided after the KGD is installed in the tester such that the write-in information (*1) for probing per die could be proceeded when the power is turned on. In the wafer level, the KGS probing stage, it performs the 3DIC stacking process and provides an ID identification access information (*2), which is an optional step. In the package level, the KGS testing stage, it performs the packaging process, provides the ID identification access information (*2), and executes the shipment, where *1 means write-in ID is necessary and writing/reading other data or testing are (is) optional, and *2 means ID verification is necessary and writing/reading other data or testing are (is) optional. Since providing the ID identification access information (*2) is an optional step, there might be three different routes. The first one is from performing the stacking process to performing the packaging process, the second one is from performing the stacking process to providing the ID identification access information (*2) and then to performing the stacking process again, and the third one is from performing stacking process to providing the ID identification access information (*2) and then to performing the packaging process. The wireless information access is performed through embedded wireless chips.

Figure 3:
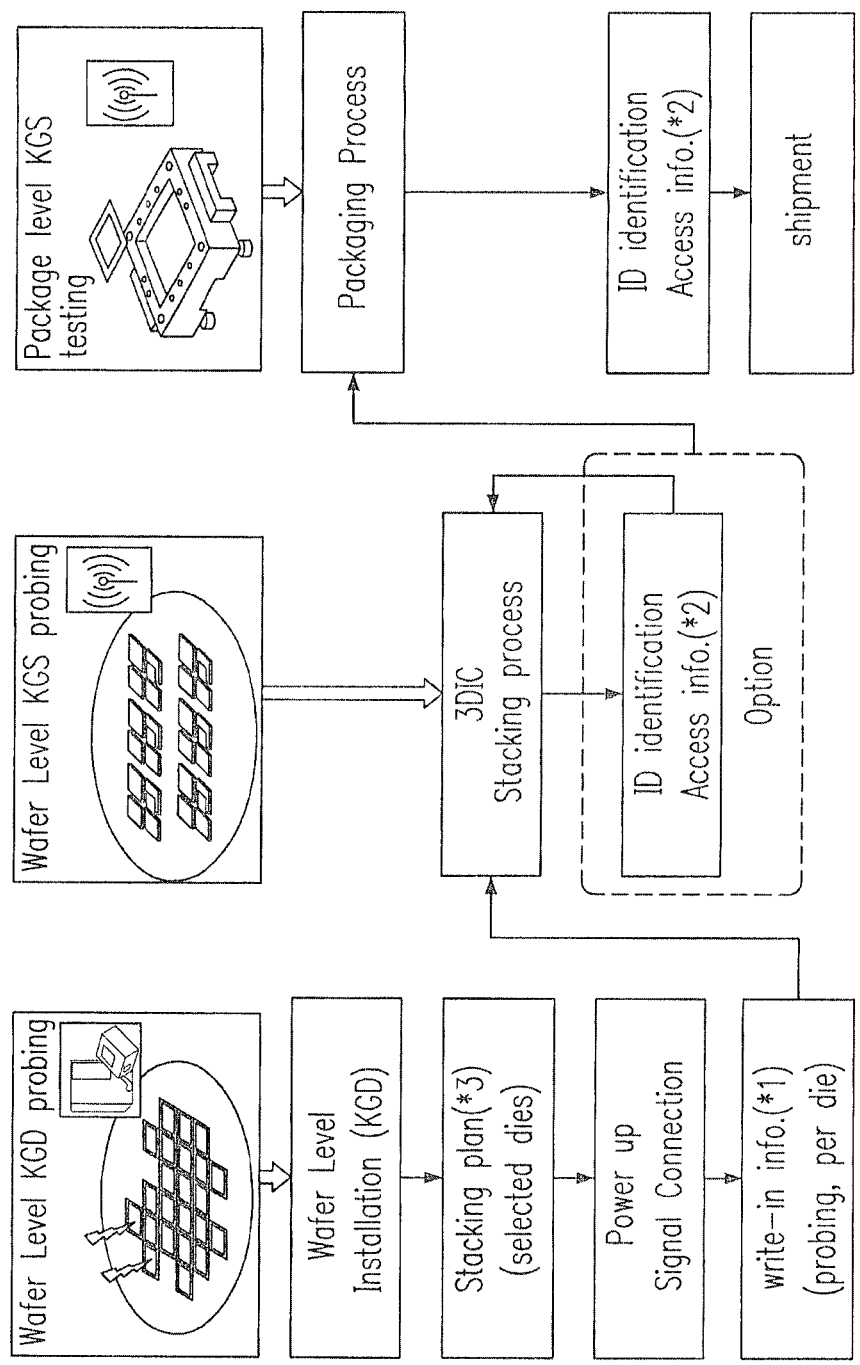
FIG. 3 is a flow chart of a method for a wireless information access of a 3DIC stacking according to the third embodiment of the present disclosure.

FIG. 3 is a flow chart of a method for a wireless information access of a 3DIC stacking according to the third embodiment of the present disclosure. FIG. 3 is similar to FIG. 2 except that there is an extra step of providing a stacking plan (*3) for selected dies between performing a wafer level installation for KGD and performing a power up signal connection, the stacking plan is provided for certain chips purchased from other manufacturers or having no stacking plan at all, where *3 indicates that the stacking plan of selected dies is decided by testing results and products after the KGD testing is done. The stacking plan is used to determine where these selected dies should be stacked on and whether a tracking die should be used. Similarly, since a conventional tester is used in the KGD probing stage of the wafer level, the power needs to be provided after the KGD is installed in the tester also such that the write-in information (*1) for probing per die could be proceeded when the power is turned on as shown in FIG. 3. Referring to FIG. 3, since the information is accessed wirelessly in the KGS probing stage of the wafer level and in the KGS testing stage of the package level, the wafer level installation for KGS as well as a power up signal connection required in both of the conventional KGS probing stage of the wafer level and the conventional KGS testing stage of the package level could be omitted too. The wireless information access is either performed through embedded wireless chips, or performed through extra embedded wireless chips (for those chips without any radio frequency (RF) circuit), which is accomplished via a configuration as shown in FIG. 1.

Figure 4:
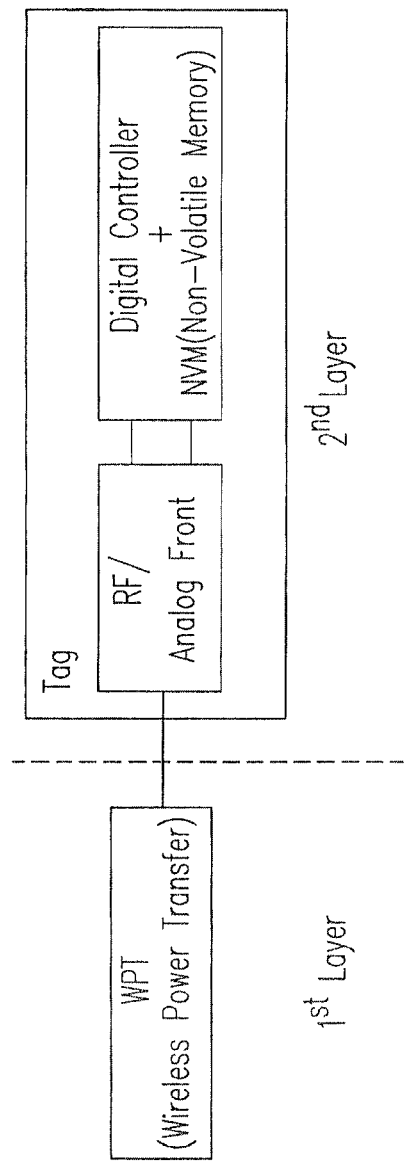
FIG. 4 is a schematic diagram of a wireless power transfer (WPT) and a tag having an RF/analog front end, digital controller and a non-volatile memory (NVM) according to the fourth embodiment of the present disclosure.

FIG. 4 is a schematic diagram of a wireless power transfer (WPT) and a tag having an RF/analog front end, digital controller and a non-volatile memory (NVM) according to the fourth embodiment of the present disclosure. The tag functions as a controller/register, the RF/analog front end performs all analog processing for DC power, receives signal detection/demodulation, and transmits modulation, the digital controller decodes incoming data, responds to commands from the transmitter (reader), reads and writes to internal memory, and encodes and transmits data to the modulator included in the RF/analog front end, and the NVM is necessary for one-time or multi-time data storage.

The function block of WPT is used as power transfer interface functioning as an antenna, the WPT can be made as an antenna, a capacitor, an inductor or any interface to receive power, and the WPT and the Tag are in the same chip or in two different stacked chips. The configuration of the WPT in the first layer and the tag in the second layer as shown in FIG. 4 is used as an embedded wireless chip/IP in 3DIC stacked chip to record information.

Figure 5A:
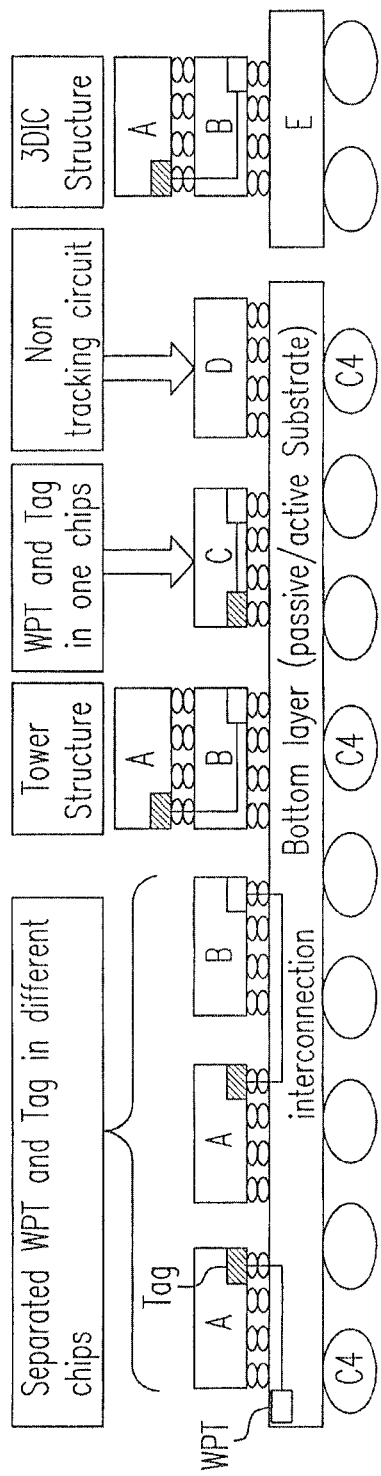
FIG. 5(a) is a schematic circuit diagram of two 3DIC stackings according to the fifth embodiment of the present disclosure.

FIG. 5(a) is a schematic circuit diagram of two 3DIC stackings according to the fifth embodiment of the present disclosure. The first 3DIC stacking located on the left-hand side has a bottom layer being one of a passive substrate or an active substrate with a plurality of C4 bumps disposed under the bottom layer of the first 3DIC stacking, and shows separated WPT and Tag in different chips, wherein the first WPT is disposed in the bottom layer, a first chip A has a tag disposed therein and connected with the first WPT, a second chip A has a tag disposed therein, and a chip B has a WPT disposed therein and connected to the tag of the second chip A. Also, the first 3DIC stacking includes a tower structure with a chip A and a chip B, wherein the chip A is disposed on the chip B and the chip B is disposed on the bottom layer. Furthermore, the first 3DIC stacking has a WPT and a Tag in one chip too, wherein the chip C having the WPT and the tag is disposed on the bottom layer. Lastly, the first 3DIC stacking also includes a Non tracking circuit being a chip D disposed on the bottom layer and having no WPT/tag. The second 3DIC stacking is located on the right-hand side, has a bottom layer of E being a passive substrate or an active substrate, a chip A and a chip B, the chip A is disposed on the chip B and the chip B is disposed on the bottom layer.

Figure 5B:
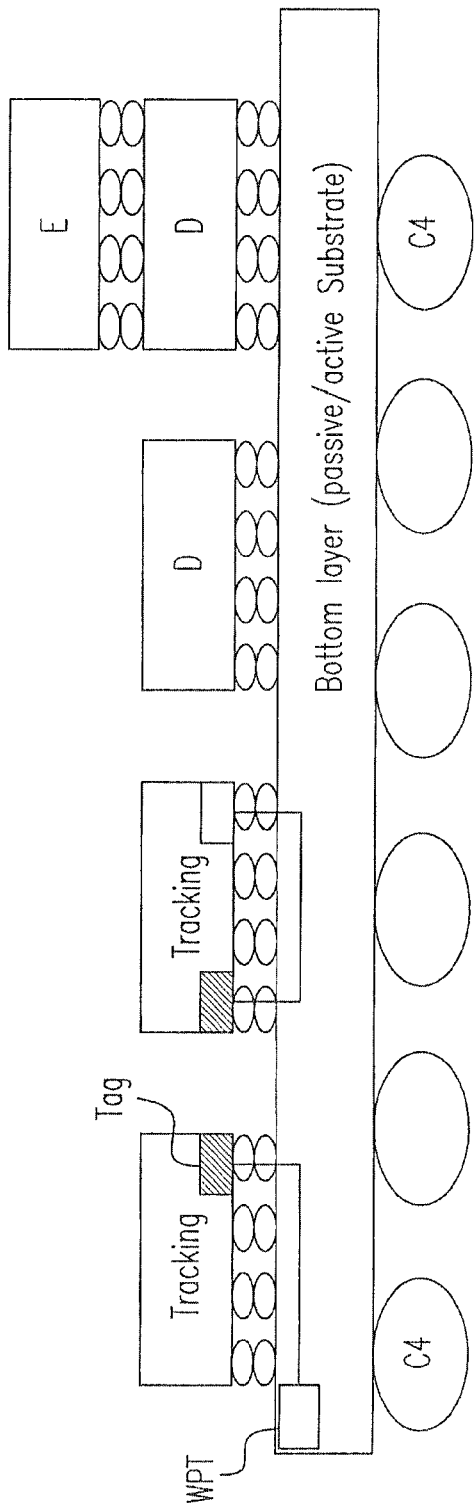
FIG. 5(b) is a schematic circuit diagram of a 3DIC stacking according to the sixth embodiment of the present disclosure.

FIG. 5(b) is a schematic circuit diagram of a 3DIC stacking according to the sixth embodiment of the present disclosure. In FIG. 5(b), at least one extra wireless chip (e.g. two tracking chips, wherein the first WPT is disposed in the bottom layer, being one of a passive substrate and an active substrate, the first tracking chip has a tag disposed therein and connected to the first WPT, and the second tracking chip has a second WPT and a tag connected to the second. WPT therein) is utilized to record information for chips/stacked chips without any RF circuit (e.g. a first chip D and a second chip D and a chip E, wherein the first chip D is disposed on the bottom layer, the chip E is disposed on the second chip D, and the second chip D is disposed on the bottom layer).

Figure 5C:
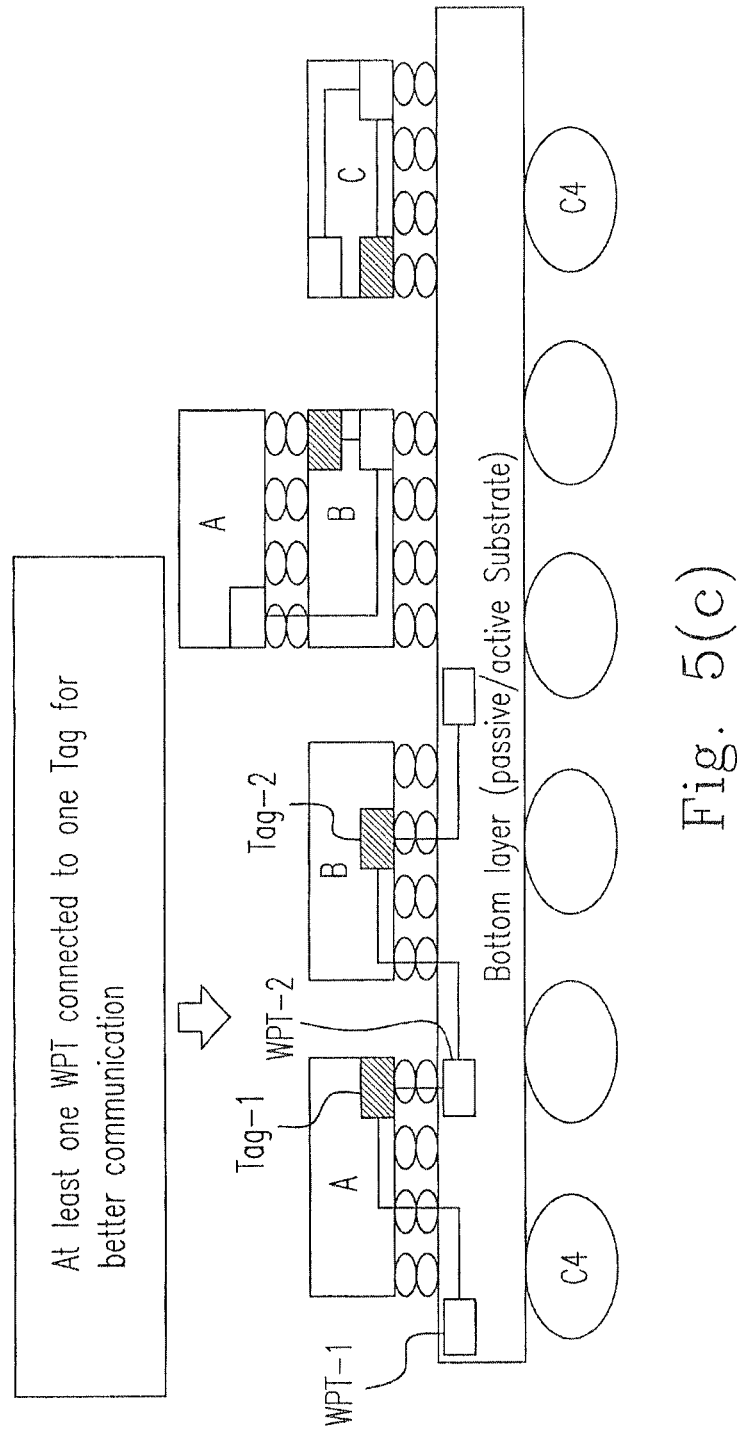
FIG. 5(c) is a schematic circuit diagram of a 3DIC stacking according to the seventh embodiment of the present disclosure.

FIG. 5(c) is a schematic circuit diagram of a 3DIC stacking according to the seventh embodiment of the present disclosure. It is desired to have a plurality of WPTs connecting to (at least) one tag for better transmitting/receiving operations. As shown in FIG. 5(c), there are the first and the second WPTs, WPT-1 and WPT-2, both disposed in the bottom layer, being one of a passive and an active substrate, and connected to a first tag, Tage-1 disposed in a first chip A. There is a second tag, Tag-2, disposed in a first chip B, and WPT-2 and a third WPT, disposed in the bottom layer, are both connected to Tag-2. Also, a second chip A having a fourth WPT is disposed on a second chip B having a third tag and a fifth WPT and disposed on the bottom layer. The fourth and the fifth WPTs are both connected to the third tag. Besides, there is a chip C having a sixth and a seventh WPTs and a fourth tag, and both of the sixth and the seventh WPTs are connected to the fourth tag. Thus, in FIG. 5(c), it shows at least one WPT is connected to one Tag for better communication.

Figure 5D:
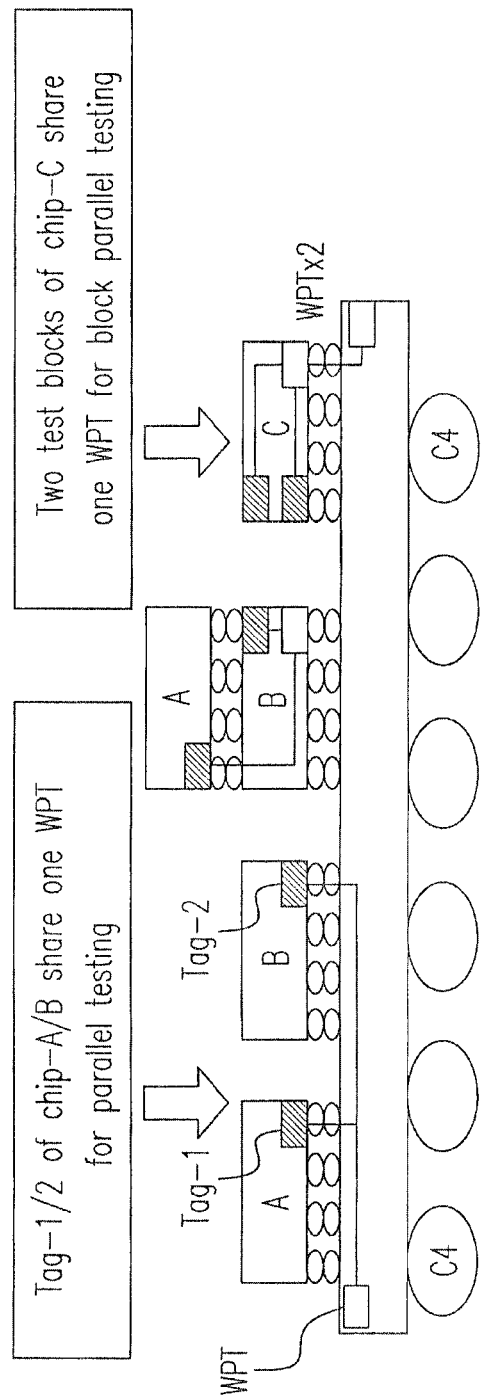
FIG. 5(d) is a schematic circuit diagram of a 3DIC stacking according to the eighth embodiment of the present disclosure.

FIG. 5(d) is a schematic circuit diagram of a 3DIC stacking according to the eighth embodiment of the present disclosure. It is desired to have (at least) one WPT connects to plurality of tags for parallel testing operations. In FIG. 5(d), Tag-1 of a first chip A, disposed on the bottom layer being one of a passive substrate or an active substrate, and Tag-2 of a first chip B, disposed on the bottom layer, share a first WPT disposed in the bottom layer for parallel testing. A second chip A having a third tag is disposed on a second chip B having a fourth tag and a second WPT, and the third and the fourth tags share the second WPT. And, two test blocks, the fifth and the sixth tags of chip-C disposed on the bottom layer, share a third WPT for block parallel testing. There is also a fourth WPT disposed in the bottom layer and connected to the third WPT.

EMBODIMENTS

There is a method for wireless information access in a three-dimensional integrated circuit (3DIC) provided in the present disclosure. This proposed method includes steps of:

providing plural stacked chips including a wireless device, an information and a transmitting/receiving circuit; and accessing wirelessly the information via the wireless device and the transmitting/receiving circuit during a packaging process for the plural stacked chips. In this embodiment, the wireless device is a wireless power transfer device (WPTD).

There is a testing method proposed in the present disclosure. This testing method includes steps of:

providing a semiconductor structure having a wireless chip;

wirelessly receiving a power by the wireless chip; and using the power to test the semiconductor structure. In this embodiment, the wireless chip is a wireless power transfer device (WPTD).

There is a 3DIC provided in the present disclosure. This 3DIC includes a semiconductor structure, and a wireless power device (WPD) formed on the semiconductor structure for wirelessly receiving a power for operating a function selected from a group consisting of probing the semiconductor structure, testing the semiconductor structure and accessing a first information from the semiconductor structure. In this embodiment, the WPD is a wireless power transfer device (WPTD).

According to the aforementioned descriptions, the present disclosure provides a 3DIC having a wireless power device (WPD) for wirelessly receiving a power for operating a function selected from a group consisting of probing the semiconductor structure, testing the semiconductor structure and accessing an information from the semiconductor structure and a method thereof to avoid the ESD damage and the area penalty so as to possess the non-obviousness and the novelty.

While the disclosure has been described in terms of what are presently considered to be the most practical and preferred embodiments, it is to be understood that the disclosure need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present disclosure which is defined by the appended claims.

What is claimed is:

1. A method for wireless information access in a three-dimensional integrated circuit (3DIC), comprising steps of:
   providing a set of stacked chips, the set of stacked chips including a wireless device and a transmitting/receiving circuit; and
   accessing wirelessly information stored in the set of stacked chips via the wireless device and the transmitting/receiving circuit during performing a packaging process for the set of stacked chips,
   wherein the set of stacked chips comprises:
      a first chip embedded with the wireless device, the wireless device being a wireless power transfer (WPT) device; and
      a second chip embedded with the transmitting/receiving circuit, the transmitting/receiving circuit being a tag, and the tag comprising:
         an RF/analog front end;
         a digital controller; and
         a non-volatile memory.

2. The method according to claim 1, wherein
the 3DIC further comprises a substrate;
the set of stacked chips further comprises:
one or more other WPTs; and
one or more other tags; and
the method further comprises accessing wirelessly another information stored in the set of stacked chips via at least one of the one or more other tags coupled with a corresponding one of the one or more WPTs, and the at least one of the one or more other WPTs is embedded in the substrate.

3. The method according to claim 2, further comprising accessing wirelessly additional information stored in the set of stacked chips via at least one of the one or more other tags coupled with the WPT device, wherein the WPT device is connected to the tag and the at least one of the one or more other tags.

4. The method according to claim 1, further comprising:
accessing wirelessly additional information stored in the set of stacked chips via another tag.

5. The method according to claim 4, wherein the accessing wirelessly the additional information is performed via the WPT device coupled with the another tag.

6. The method according to claim 4, wherein the accessing wirelessly the additional information is performed via another WPT device coupled with the another tag, the another WPT device being embedded in the set of stacked chips or a substrate of the 3DIC.

7. A three-dimensional integrated circuit (3DIC), comprising:
a semiconductor structure, comprising a set of stacked chips; and
a wireless power device (WPD) embedded in the semiconductor structure for wirelessly receiving a power for operating a function selected from a group consisting of probing the semiconductor structure, testing the semiconductor structure, and accessing first information stored in the set of stacked chips,
wherein
the set of stacked chips embedded with the WPD and a transmitting/receiving circuit, the WPD being a first wireless power transfer (WPT) device, the transmitting/receiving circuit being a first tag, and the first tag comprising:
an RF/analog front end;
a digital controller; and
a non-volatile memory; and
the first WPT device and the first tag are in two different chips of the set of stacked chips.

8. The 3DIC of claim 7, wherein
the RF/analog circuit electrically coupled with the first WPT device;
the digital controller coupled with the RF/analog front end; and
the non-volatile memory coupled with the digital controller.

9. The 3DIC of claim 7, further comprising a second WPT device electrically coupled with the first tag, the second WPT device being embedded in a substrate of the semiconductor structure.

10. The 3DIC of claim 7, wherein
the first WPT device is embedded in a first chip of the set of stacked chips;
the first tag is embedded in a second chip of the set of stacked chips; and
the 3DIC further comprises a second WPT device embedded in the second chip of the set of stacked chips and electrically coupled with the first WPT device.

11. The 3DIC of claim 7, wherein
the first WPT device is embedded in a first chip of the set of stacked chips;
the first tag is embedded in a second chip of the set of stacked chips; and
the 3DIC further comprises a second tag embedded in the first chip and electrically coupled with the first WPT device.

12. The 3DIC of claim 7, wherein
the first WPT device is embedded in a first chip of the set of stacked chips;
the first tag is embedded in the first chip of the set of stacked chips; and
the 3DIC further comprises a second tag embedded in the first chip and electrically coupled with the first WPT device.

13. The 3DIC of claim 7, further comprising a second tag embedded in the set of stacked chips and electrically coupled with the first WPT device.

14. A method of accessing a three-dimensional integrated circuit (3DIC), the 3DIC comprising a substrate and a set of stacked chips over the substrate, the set of stacked chips comprising a first chip and a second chip electrically coupled with each other, and the method comprising:
receiving an electromagnetic signal by a first wireless power transfer (WPT) device of the 3DIC;
based on operation of a first tag in the first chip and in response to an instruction extracted from the electromagnetic signal, accessing first information contained in the set of stacked chips, wherein the first WPT device is embedded in the second chip or is embedded in the substrate of the 3DIC.

15. The method of claim 14, further comprising:
storing, into the first chip, a result of a known good die (KGD) test performed on the first chip.

16. The method of claim 14, wherein the accessing the first information is performed during a stacking process of forming the set of stacked chips of the 3DIC.

17. The method of claim 14, wherein
the first WPT device is embedded in the substrate of the 3DIC; and
the method further comprises:
transmitting the electromagnetic signal to the first tag through an interconnection structure embedded in the substrate of the 3DIC.

18. The method of claim 14, wherein
the first WPT device embedded in the second chip of the 3DIC; and
the method further comprises:
transmitting the electromagnetic signal to the first tag without going through the substrate of the 3DIC.

19. The method of claim 14, further comprising a second WPT device, wherein
the second WPT device is embedded in the first chip; and
the method further comprises:
transmitting the electromagnetic signal to the tag through an interconnection structure embedded in the substrate of the 3DIC.

20. The method of claim 14, further comprising:
accessing, by operating a second tag of the 3DIC, second information contained in the set of stacked chips in response to the instruction extracted from the electromagnetic signal, the second tag being configured to receive the electromagnetic signal through the first WPT device, and the second tag being embedded in the second chip.

* * * * *